United States Patent [19]
Wenckus et al.

[11] 4,049,384
[45] Sept. 20, 1977

[54] COLD CRUCIBLE SYSTEM

[75] Inventors: Joseph F. Wenckus, Needham; Wilson P. Menashi, Lexington; Roger A. Castonguay, Salem, all of Mass.

[73] Assignee: Arthur D. Little, Inc., Cambridge, Mass.

[21] Appl. No.: 567,714

[22] Filed: Apr. 14, 1975

[51] Int. Cl.² .................... B01D 9/00; B01J 17/18; B01J 17/20
[52] U.S. Cl. .................... 23/273 SP; 13/6; 13/26; 13/27; 156/617 SP; 219/10.49
[58] Field of Search .......... 23/273 A, 273 B, 273 M, 23/273 SP; 156/616, 617 SP, 618; 165/153, 168, 169, 173; 13/6, 26, 27; 219/10.49

[56] References Cited

U.S. PATENT DOCUMENTS

| | | | |
|---|---|---|---|
| 3,057,703 | 10/1962 | Knapic | 23/273 SP X |
| 3,156,549 | 11/1964 | Kelemen | 13/6 X |
| 3,461,215 | 8/1969 | Reboux | 13/27 |
| 3,520,980 | 7/1970 | Sterling et al. | 13/27 |
| 3,531,574 | 9/1970 | Sterling et al. | 13/27 |
| 3,542,521 | 11/1970 | Kulling et al. | 165/169 X |
| 3,582,528 | 6/1971 | Seale | 13/27 |
| 3,615,878 | 10/1971 | Chang et al. | 156/617 SP |
| 3,702,368 | 11/1972 | Hukin | 13/26 |
| 3,759,670 | 9/1973 | Rummel | 23/273 SP X |
| 3,824,302 | 7/1974 | Alexandrov et al. | 23/273 SP X |
| 3,865,554 | 2/1975 | Wenckus et al. | 23/273 SP |
| 3,898,051 | 8/1975 | Schmid | 23/273 SP X |

FOREIGN PATENT DOCUMENTS 1,130,070  10/1968  United Kingdom

OTHER PUBLICATIONS

Fifth International Symposium of Electroslag and Other Melting Tech., Part II, pp. 460-819 (476-497) Oct. 10, 1974.

Primary Examiner—Morris O. Wolk
Assistant Examiner—Michael S. Marcus
Attorney, Agent, or Firm—Bessie A. Lepper

[57] ABSTRACT

A cold crucible system is provided which is suitable for carrying out the process of "skull" melting wherein highly refractory materials are melted by inductive heating in a manner to maintain the molten material in a shell of the material cool enough to act as a crucible. The cold crucible system incorporates a crucible formed as two separate halves held in a manner to define a narrow electrically insulating space between them. Each half section comprises a plurality of copper tubes forming half of a "cage." Each tube of the cage has a concentric smaller tube therein whereby there are defined in each tube an outer annular and a central inner fluid passage through which a fluid coolant is circulated. The system is formed as a module capable of being located within a controlled atmosphere chamber. The crucible system is readily adapted to Czochralski crystal growth, for use with a seed crystal to induce directional crystal growth by the Bridgeman technique and to centrifugal casting.

15 Claims, 12 Drawing Figures

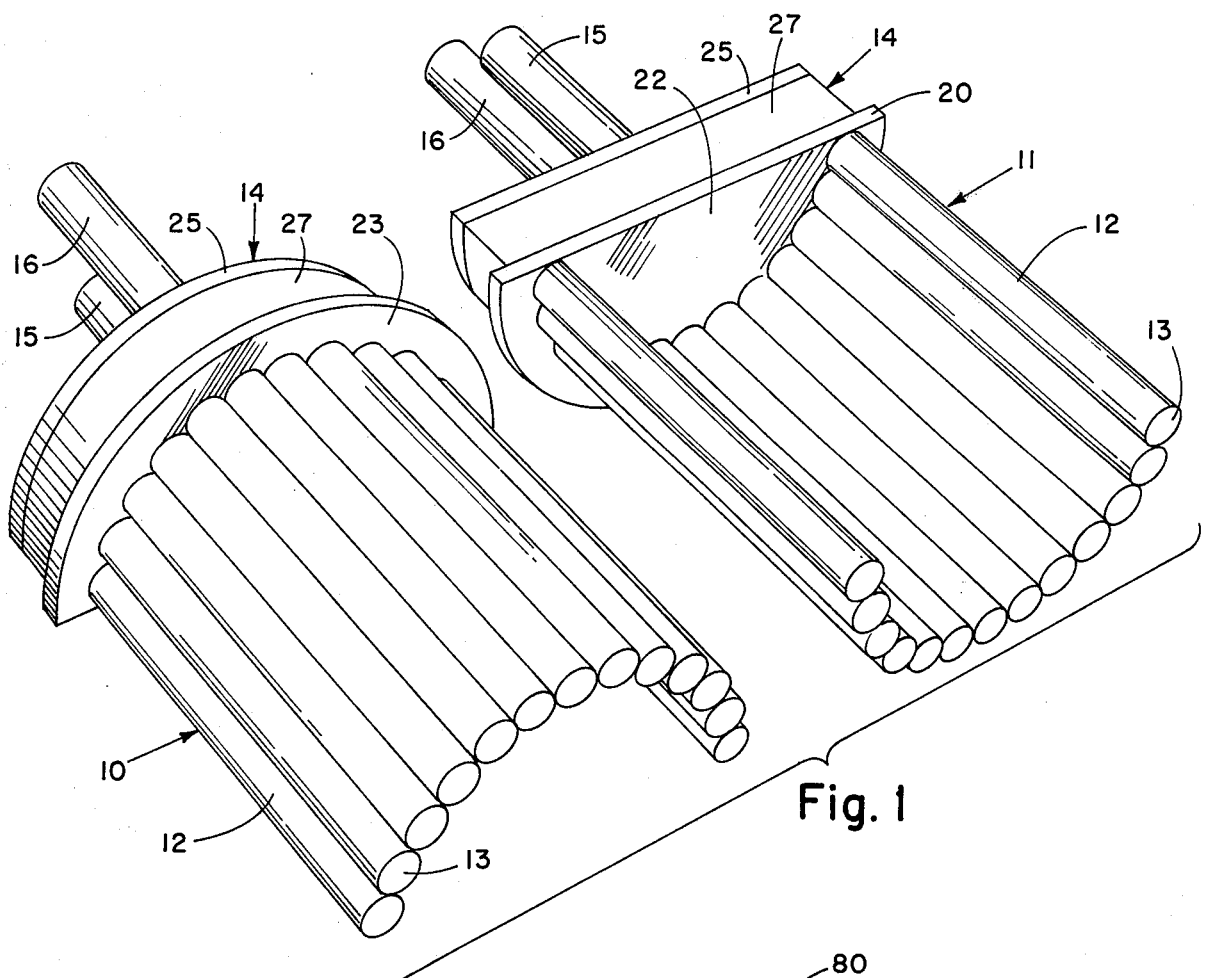
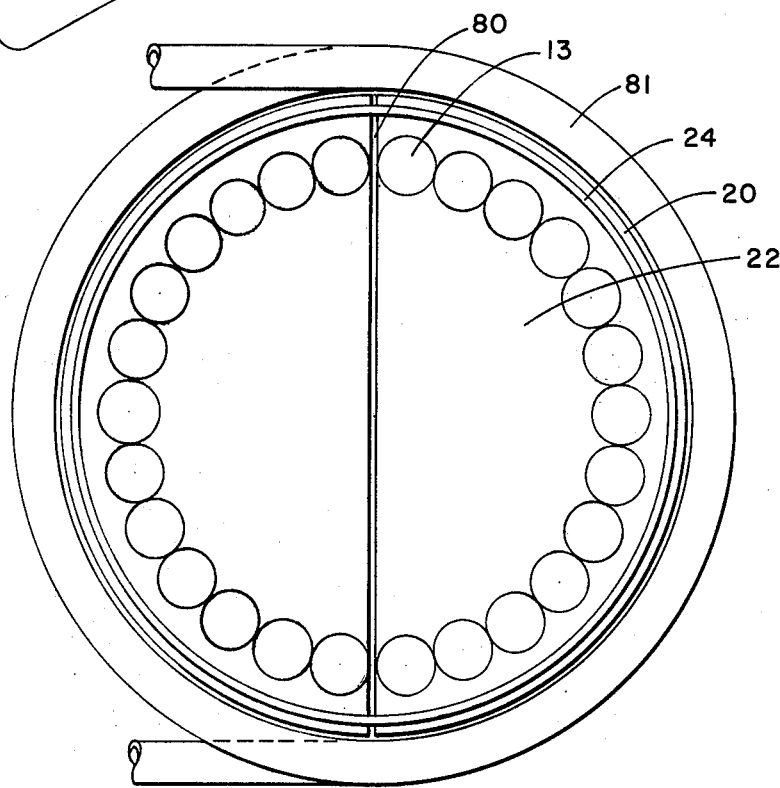
Fig. 1
Fig. 5

COLD CRUCIBLE SYSTEM

This invention relates to a cold crucible and more particularly to a cold crucible system suitable for the synthesis and crystal growth, by Czochralski and Bridgeman techniques, of refractory semiconductors and oxides including those which must be handled in controlled atmospheres.

The process known as "skull" melting is known in the art. In this process a refractory, i.e., a high-melting material, in the form of a solid is contained in a water-cooled, crucible-like structure and it is then heated by direct high-frequency induction heating. By cooling the outer surface of the material mass a sintered shell or "skull" of the material is formed to contain an internal molten mass. Thus the melt, which may be used for casting, recrystallization or crystal formation by the Czochralski or Bridgeman techniques, is free from contamination. Moreover, this process makes it possible to contain stable, uncontaminated melts of even the most refractory materials for which no crucibles are known to exist. Thus the previously severe, if not insoluble, problems of containment and contamination have been reduced or essentially eliminated.

The ability to synthesize refractory semiconductors and to crystallize such refractory oxides such as $Y_2O_3$ (m.p. 2376° C), $ZrO_2$ (m.p. 2690° C), $La_2O_3$ (m.p. 2300° C) and $HfO_2$ (m.p. 2790), as well as mixed oxides such as $LaAlO_3$ (m.p. 2100° C), $CaZrO_3$ (m.p. 2345° C) and the like means that it may be possible to provide such materials as unique laser crystals, refractory optical elements and melt-cast ceramics.

Previously constructed cold crucible systems have been made by using a plurality of U-shaped copper tubings, each end of each tubing being connected to flexible hose for introducing cooling water into and withdrawing cooling water from the tubing so that the water is circulated through the tubings. (See for example British Pat. No. 1,130,070.) Each tubing in such a system must be insulated from the adjacent tubing and separate means must be provided to circulate the water through each tubing, thus limiting the operation of the system to ambient atmosphere in which the multiple hose connections can be handled. This, in turn, means that such a prior art system can not handle those materials which must be processed in special atmospheres, i.e., under pressure, in an inert environment, and the like. Moreover, such a prior art system rules out processing materials which give rise to intolerable contamination of the atmosphere around them. Thus BeO (m.p. 2530° C) which is toxic and $ThO_2$ (m.p. 3050° C) which is radioactive must be properly contained for the sake of safety. Also ruled out in the use of such prior art apparatus is the processing of material which decompose upon melting at atmospheric pressures. For example, barium ferrite, $BaFe_{12}O_{19}$, (m.p. over 1500° C) requires approximately 40 atmospheres of oxygen over the melt to maintain stoichiometry. Finally, such prior art apparatus is not readily adaptable to centrifugal casting.

There is, therefore, a need for a cold crucible system which is simple and rugged, and in the form of a modular assembly readily adaptable for operation in a controlled-atmosphere furnace as well as for operational modifications such as Czochralski crystal growth and centrifugal casting.

It is therefore a primary object of this invention to provide an improved cold crucible construction. A further object is to provide a cold crucible system for skull melting which is simple and rugged and which is in a modular form making it possible to use it within a wide range of atmospheres including those of controlled temperature and pressure. It is another object of this invention to provide a cold crucible system of the character described which can be used for the synthesis of refractory semiconductors and for the production of high purity single crystal oxides heretofore not possible to handle. Yet another object is to provide a cold crucible system which lends itself to modifications which make possible Czochralski crystal growth, controlled directional crystal growth, centrifugal casting and the introduction of gases into the melt. A further object is to provide apparatus for the formation of unique materials usuable for lasers, refractory optical elements and melt-cast ceramics.

Other objects of the invention will in part be obvious and will in part be apparent hereinafter.

The invention accordingly comprises the features of construction, combination of elements, and arrangement of parts which will be exemplified in the construction hereinafter set forth, and the scope of the invention will be indicated in the claims.

According to one aspect of this invention there is provided a cold crucible formed of two complementary half-section semicircular assemblies. Each of these assemblies comprises a plurality of contacting, vertically-oriented copper tubes defining a semiannular wall, having fluid-tight caps, and being mounted in compartmentalized fluid distribution means which has a fluid inlet and a fluid discharge manifold. The fluid distribution means provides a bottom for the crucible and the two half-section assemblies are mounted in close but spaced relationship to define a cylindrically configured container for the material to be processed. Each of the copper tubes has within it a concentric, open-ended, smaller diameter copper tube which defines a fluid passage extending from the fluid outlet manifold to within a short distance from the cap, and this small-diameter tube defines within the tube an annular fluid channel which provides fluid communication between the fluid passage in the channel and the fluid inlet manifold. Means are also provided to introduce a cooling fluid into the fluid inlet manifold of each semicircular half-section assembly and to withdraw the fluid from the discharge manifold of each assembly.

In another aspect of this invention a cold crucible system is provided which comprises, in addition to the cold crucible, fluid inlet and discharge means common to both of the semicircular half-section assemblies and arranged to provide means to removably mount the system as a modular unit in a standard high-temperature, high-pressure furnace. This system also includes rf coils to inductively heat the material contained in the crucible and an annular quartz shield placed between the rf coils and the copper tubing forming the crucible.

In yet further aspects of this invention there are provided thermal radiation shield means to control the condition of the melt surface for Czochralski crystal growth, means to mount a seed crystal on the base plate to induce directional crystal growth, means to spin the crucible and means to inject gases into the melt for reaction or purification.

For a fuller understanding of the nature and objects of the invention, reference should be had to the following detailed description taken in connection with the accompanying drawings in which FIG. 1 is a perspective view of the two semicircular half-section assemblies showing them as separate entities;

FIG. 5 is a top plan view of the cold crucible system of this invention;

Figures 2, 3, 4:
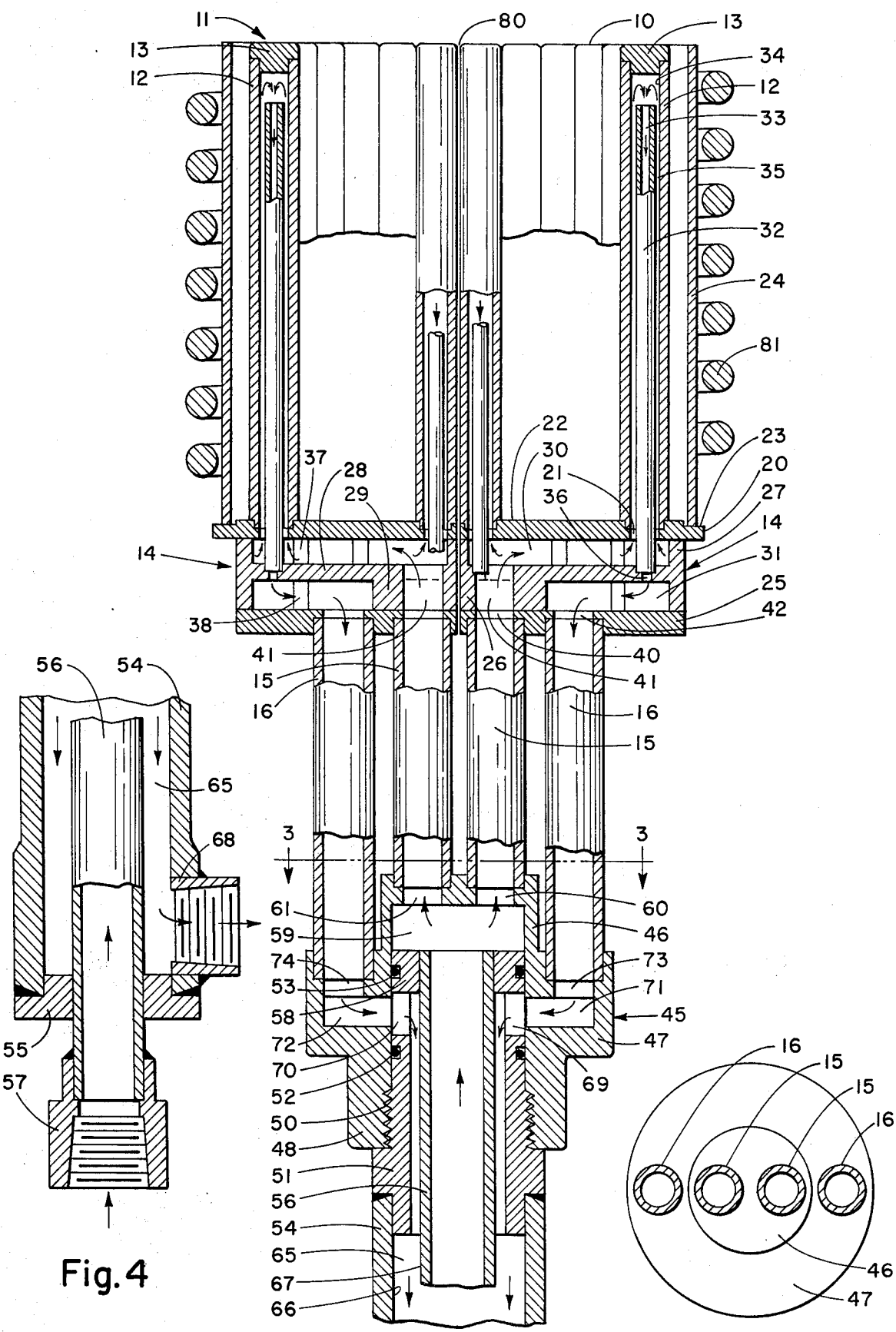
FIG. 2 is a longitudinal cross section of the upper end of the cold crucible system of this invention including the cold crucible, the common fluid inlet and discharge means and the modular forming connection means.
FIG. 3 is a cross section through plane 3—3 of FIG. 2.
FIG. 4 is a longitudinal cross section of the lower end of the cold crucible system which is an extension of FIG. 2.

FIGS. 1-5 illustrate the basic construction of the cold crucible of this invention and the system in which it is incorporated. In all of these drawings the same reference numerals are used to identify the same elements. FIG. 1 illustrates in perspective the two half assemblies 10 and 11 of the cold crucible prior to assembly into the system. Each half assembly is formed of a plurality of copper tubes 12 having fluid-tight end caps 13. These caps 13 are used to seal off tubes 12 and any other means for sealing these tubes may also, of course, be used. The copper tubes are mounted in a compartmentalized fluid distribution means such as bustle 14, the construction of which is detailed in FIG. 2. An inlet fluid conduit 15 and a discharge fluid conduit 16 provide fluid communications with the manifolds. The cold crucible is formed as the two half-sections 10 and 11 and assembled to define a narrow spacing between to avoid these sections' acting as a dead short to the rf field. As will be detailed below in the description of FIG. 2, an electrical crossover point between the sections may be made within the modular mounting member below the crucible.

FIGS. 2-5 show the details of this basic construction of the cold crucible and the system in which it is incorporated. Since the crucible is constructed as two complmentary half-sections it will be sufficient to describe one section, the other one being identical in construction. The copper tubes 12, with caps 13, are rigidly mounted, as by brazing, in a-cover plate 20 of fluid distribution bustle 14, which has a number of apertures 21 cut to seat the tubes 12. The external surface 22 of the two semicircular cover plates serves as the bottom of the crucible while their combined peripheral rims 23 serve as a seat for an annular quartz shield 24. Each semicircular fluid distribution bustle 14 has a bottom plate 25 joined to its cover plate 20 by a flat diametrical side piece 26 and a semicircular side piece 27, the latter being configured to provide a horizontal divider plate 28 and vertical divider piece 29 within the fluid distribution bustle. There is therefore defined within the fluid distribution bustle a fluid inlet manifold 30 and fluid discharge manifold 31.

Within each of copper tubes 12 is positioned a smaller diameter copper tube 32 having a fluid passage 33. Copper tube 32, which is open on both ends, extends from horizontal divider plate 28, in which it is seated, to near the cap end of tube 12. Tube 32 is concentric with tube 12 and defines with internal wall 34 of tube 12 an annular fluid passage 35. This fluid passage 35 is in direct communication with fluid inlet manifold 30 through aperture 21 in cover plate 20 and with the top of passage 33 in tube 32. Passage 33 is, in turn, in fluid communication with discharge manifold 31 through aperature 36 in horizontal divider plate 27 in which it is rigidly held as by being brazed thereto. Fins 37 and 38 are positioned within inlet manifold 30 and discharge manifold 31, respectively, to especially facilitate the use of the crusible under high pressure conditions.

As is seen in FIGS. 1 and 2, each half-section has its own inlet fluid conduit 15 and discharge fluid conduit 16. The shorter inlet conduit 15 is affixed at its upper end to bottom plate 25 along the lip of aperture 40 which is in turned aligned with aperture 41 in vertical divider piece 29. This results in providing fluid communication between inlet conduit 15 and inlet manifold 30. The longer discharge conduit 16 is seated in the lip of aperture 42 in bottom plate 25 and is therefore in fluid communication with discharge manifold 31.

The lower ends of conduits 15 and 16 are removably engagable with crucible mounting member 45 which consists of an upper small-diameter inlet section 46, a central larger-diameter discharge section 47 and a lower smaller diameter adapter section 48. This crucible mounting member which is a single piece serving both crucible halves is the electrical crossover point for the current in the crucible and is preferably removed from the bottom (cover plate 20) of the crucible by a distance approximately equal to the inside diameter of the crucible. Actually, little current flows through crucible mounting member 45.

A portion of the internal surface of adapter section 48 is threaded to engage threads 50 of an adapter piece 51 which is configured to make a relative tight fit with the internal surfaces of central and upper sections 47 and 46 of the crucible mounting member. Elastomeric sealing rings 52 and 53 provide the required fluid seals for the various fluid passages defined within crucible mounting member 45 and adapter piece 51.

Adapter piece 51 is, in turn, welded to an extended stainless steel tube 54 having a bottom plug 55 (FIG. 4). A smaller diameter stainless steel tube 56, terminating at its lower end in an adapter 57, suitable for connection with a source (not shown) of a cooling fluid, extends through plug 55, throughout the length of tube 54, through adapter piece 51 and into upper inlet section 46 where it terminates in an annular ring piece 58 grooved to hold sealing ring 53. Tubing 56 opens into inlet fluid manifold 59 in inlet section 46 of the crucible mounting member. Inlet manifold 59 is, in turn, in communication with the two inlet conduits 16 through apertures 60 and 61.

A fluid channel 65 is defined between internal surface 66 of tube 54 and the external surface 67 of tube 56. This channel communicates at its lower end (FIG. 4) through adapter 68 with a discharge fluid receptable (not shown) and at its upper end with diametrically opposed ports 69 and 70 cut in adapter piece 51. These ports 69 and 70 are, in turn, aligned with diametrically opposed channels 71 and 72 cut in central discharge section 47 of crucible mounting member 45. These channels open into apertures 73 and 74, respectively, into which the two discharge conduits 16 from the two halves are seated.

It is possible now to trace the flow path of the cooling liquid through the cold crucible system. It will be assumed that water is used for the cooling fluid, although other liquids may be used. Water from a source (not shown) attached through adapter 57 is forced upwardly through conduit 56 into manifold 59 in crucible mounting member 45. There it is split into two streams to continue flowing in the separate inlet conduits 16, one of which is associated with half-section 10 and the other with half-section 11 of the cold crucible. From inlet conduit 16 the water flows through inlet manifold 30 and into the annular passage 35 of each copper tube 12 through aperture 21. Thus the colder water flows in direct contact with the outer wall of copper tube 12 before returning through channel 33 in tube 32. This delivers the maximum cooling to the copper "cage" defining the side walls of the crucible as well as to the bottom of the crucible. The configuration of this copper cage, with the copper tubes 12 of each half in contact along their outer surfaces, maximizes the heat transfer surface.

The returning cooling liquid from channel 33 is discharged into the separate discharge manifold 31 and from there it is taken through discharge conduits 16 which carry it into passages 71 and 72 through which it enters annular passage 65 for discharge into a suitable receptacle.

As will be apparent from FIGS. 1, 2 and 5, each of the two half sections 10 and 11 of the cold crucible are complete entities and are adapted to be removably seated in the crucible mounting member 45. When sections 10 and 11 are placed in this mounting member there remains a narrow spacing 80 between them, thus electrically isolating these sections to prevent dead shorting of the rf current flowing in rf coils 81. As noted above, the first electrical crossover point of these sections is in the crucible mounting member 45. The quartz shield 24 is placed between the copper cage of tubes 12 and rf coils 81 to prevent any contact between the copper tubes and coils and to prevent any powdered material in the crucible during startup from spilling out. Once heating is begun, a sintered outer layer of material rapidly forms to contain the material within the crucible in accordance with the principles of the "skull" melting technique.

In constructing the cold crucible, those elements which make up the heat transfer surfaces and/or are required to be electrical conducting are preferably formed of copper. Thus all of the cold crucible (sections 10 and 11 of FIG. 1) as well as the crucible mounting member 45 and adapter piece 51 are preferably of copper. Conduit 56 may be copper or stainless steel; and conduit 54 is preferably stainless steel.

The modular construction of the cold crucible system of this invention permits it to be placed within a high-temperature, high-pressure furnace such as is described in U.S. Pat. Nos. 3,639,718 and 3,865,554. These furnaces permit the interchangeability of rf coils and the installation through suitable sealing means of the required coolant circulation system. The fact that the cold crucible system of this invention can be used in such furnaces extends the technique of "skull" melting to materials, heretofore not subject to this process, which require special atmospheres. Thus beryllia, BeO, which is toxic and thoria, $ThO_2$, which is radioactive can be processed within the confined atmosphere of the furnace. Moreover, materials which are volatile can be handled by maintaining them under an inert gas pressure and materials which decompose when melted at atmospheric pressure may be precessed under gas pressures which prevent such decomposition.

FIGS. 6–12 illustrate modifications of the cold crucible of this invention which make it especially suitable for crystal growth using the Czochralski and Bridgeman techniques, adaptable for centrifugal casting and suitable for introduction of a gas into the melt.

Figure 6:
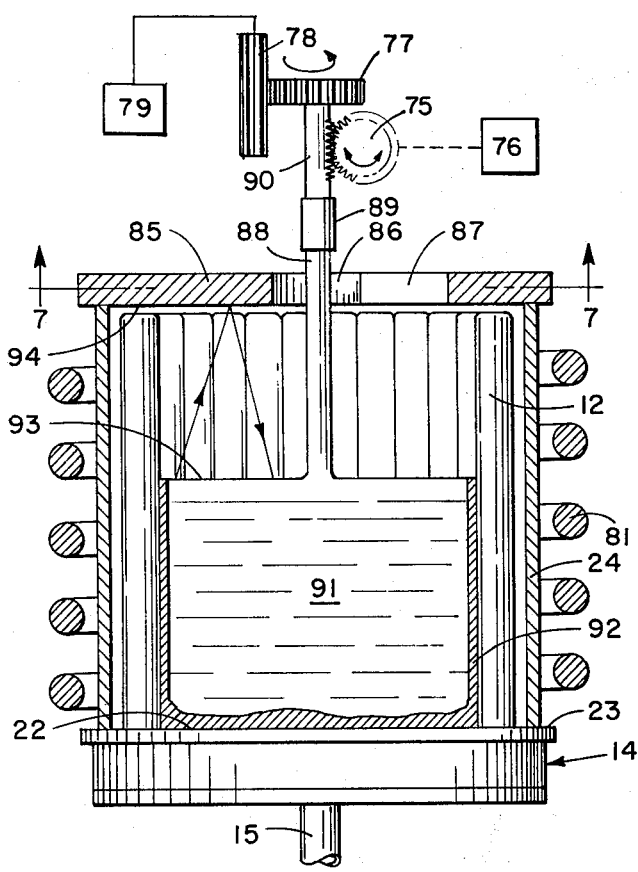
FIG. 6 is a side view, partly in cross section of one half-section assembly showing the use of one embodiment of a thermal radiation shield during crystal formation by the Czochralski technique.
Figure 7:
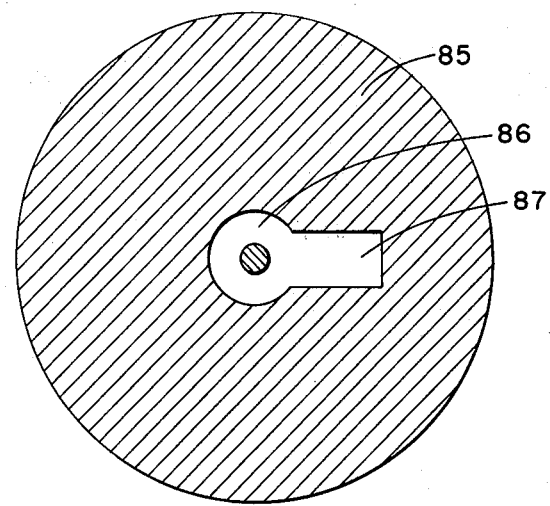
FIG. 7 is a top plan view of the thermal radiation shield of FIG. 6.

FIGS. 6–9 show two possible modifications of thermal radiation shields placed on the crucible to make it suitable for pulling crystals from the melt by the Czochralski technique. In FIGS. 6 and 7, the radiation shield is a flat plate 85, formed from a material such as $ZrO_2$. The plate 85 has a central opening 86 and a viewing slot 87 cut on one side of opening 86. The crystal 88, held in a chuck 89, is pulled through central opening 86. Chuck 89 is, in turn attached to a load-bearing pulling rod 90, such as for example rod 19 of the pulling mechanism described in U.S. Pat. 3,552,931. Means to impart translational motion to such a rod are described in detail in U.S. Patent 3,552,931 and are shown in schematic form in FIg. 6 as comrising rod 90, in the form of a rack, engaging a pinion 75 driven by motor 76. Means to achieve rotational motion, also incorporated in the mechanism of U.S. Pat. No. 3,552,931, are shown schemtically in FIG. 6 to comprise gear 77 affixed to rod 90, spline 78 engaging gear 77 and motor 79 driving spline 78. The crystal is pulled from melt 91 which is contained in the solid shell 92 of the material being processed. It will be appreciated that melt 91 and shell 92 in FIG. 6 are represented in somewhat stylized form, since the walls of the shell may vary in thickness and since the melt may be of a more irregular shape.

The use of radiation shield 85 maintains the upper surface 93 of melt 91 in a truly molten condition so that crystal 88 may be pulled from it. This results from the fact that the radiation emitted from surface 93 is reflected back onto it by the bottom or internal surface 94 of radiation shield 85.

Figure 9:
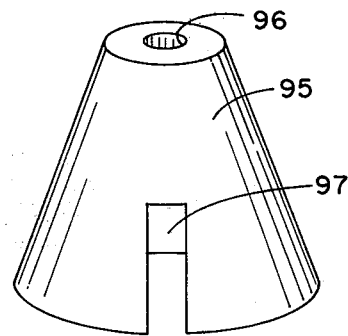
FIG. 9 is a perspective view of the thermal radiation shield of FIG. 8.
Figure 8:
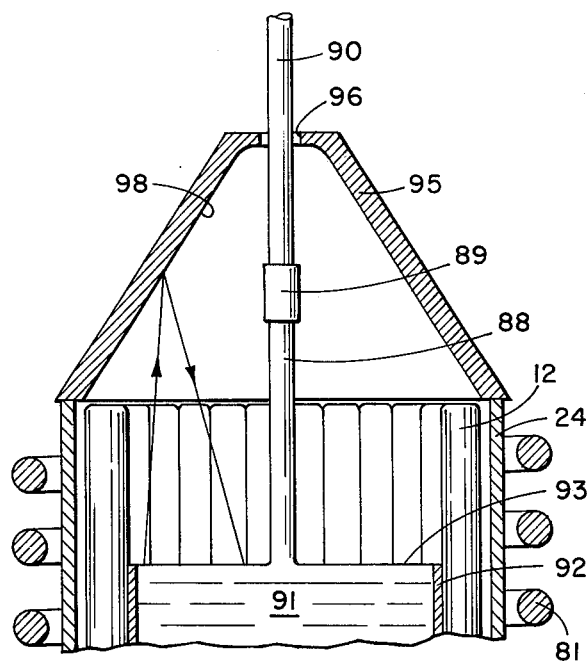
FIG. 8 is a partial cross section of one half-section assembly showing the use of another embodiment of a thermal radiation shield during crystal formation by the Czochralski technique.

FIGS. 8 and 9 illustrate a frustoconically configured radiation shield 95. Like radiation shield 85, it has a central opening 96 through which pulling rod 90 and/or the crystal 88 may pass. Frustoconical shield 95 has a side viewing slot 97. The internal surface 98 of radiaton shield 95 reflects radiation from the melt back onto the melt surface 93 and permits a relatively long crystal to be grown which remains within the radiation shield.

Figure 10:
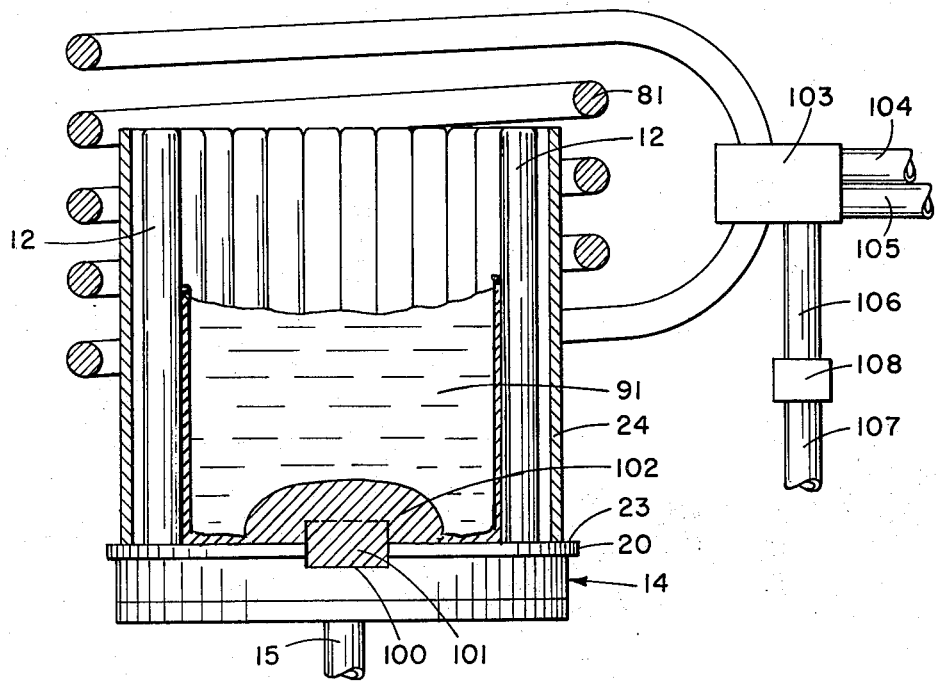
FIG. 10 is a side view, partly in cross section, of one half-section assembly showing the use of a seed crystal and of movable rf coils to induce directional cooling of the melt.

The modification shown in FIG. 10 illustrates the use of the system of this invention for forming crystals by the Bridgeman technique which is based upon directional cooling of a melt. The cooling fluid distribution bustle 14 is configured in both half-sections to have a centrally positioned well 100 to contain a seed crystal 101, which is positioned in the well during the loading of the crucible. Thus the wall of the fluid distribution means which serves as the bottom of the cylindrically container defined by the two semiannular copper tube assemblies provides this seed well. This seed crystal must extend into melt 91 at the time the formation of the crystal is begun. In FIG. 10 its original outline is shown by a dotted line since that drawing illustrates the condition of the melt after partial formation of crystal 102.

In order to achieve directional cooling it is necessary to be able to effect relative movement between the crucible and the rf coils, i.e., the crucible must be moved downwardly or the rf coils must be moved upwardly. In FIG. 10, the latter situation is shown. Rf coil 81 is seen to be terminated in a coupling 103 from which conduit lines 104 and 105 lead to a power source (not shown) in the well-known manner. Coupling 103 is attached through an insulating rod 106 to a load-bearing rod 107 (such as rod 19 of the mechanism described in U.S. Pat. No. 3,552,931) through a chuck 108. Thus, by this means it is possible to move rf coil 81 upwardly and cool the melt in contact with seed 101 from the bottom up.

Figure 11:
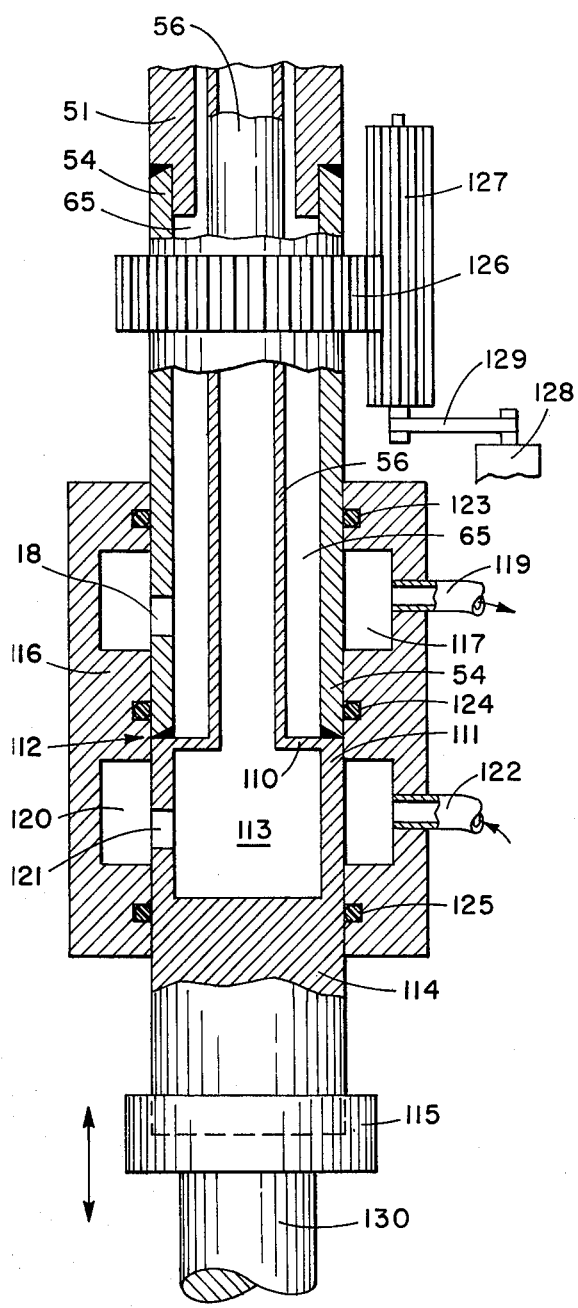
FIG. 11 is a longitudinal cross section of the lower end of the cold crucible system illustrating means for rotating the system for centrifugal casting.

FIG. 11 illustrates means for spinning the crucible assembly during the cooling operation to induce the formation of tubular or dome shaped crystals and hence achieve centrifugal casting. To achieve this spinning operation, modifications must be made in the bottom terminal ends of annular fluid channel 65 carrying the discharged cooling fluid and in the inner tubing 56 carrying the cooling fluid to the crucible tubings 12. As seen in FIG. 11, in this modification inner tubing 56 is joined through shoulder 110 to a tubing 111, the diameter of which corresponds to that of outer tubing 54 such that the lower end of tubing 54 may be affixed to shoulder 110 and form a rigid cylindrical unit 112 of tubings 54 and 111. Tubing 111 has a chamber 113 and terminates in a solid section 114 which is rotatable in chuck 115 supporting the crucible assembly.

A stationary bearing-like member 116 surrounds and aligns the cylindrical unit 112 and provides the necessary means for introducing and withdrawing fluids from tubings 54 and 56. Thus bearing member 116 has an upper annular chamber 117 positioned to communicate with one or more openings 118 in tubing wall 54 to receive discharged fluid from annular channel 65. A discharge line 119 provides fluid communication between chamber 117 and a reservoir (not shown) for the discharged fluid. Bearing member 116 has a lower annular chamber 120 positioned to communicate with one or more openings 121 in chamber 113 to introduce cooling fluid into the passage within tubing 56. An inlet line 122 provides fluid communication between chamber 113 and a source of cooling fluid (not shown). A series of O-ring seals 123, 124 and 125 provide the necessary sealing between bearing member 116 and cylindrical unit 112.

The spinning of the crucible assembly, in the embodiment shown in FIG. 11, is accomplished by affixing a gear 126 to the outer wall of tubing 54 and providing a driving means such as spline 127, engageable with gear 126, and means to rotate spline 127 such as motor 128 and belt 129. Translational motion of the crucible assembly is effected by mounting it through chuck 115 on a load-bearing rod 130, such as rod 19 of the mechanism described in U.S. Pat. No. 3,552,931 and shown schematically for rod 90 of FIG. 6. If the relative motion between rf coils 81 and the crucible during spinning is effected by moving the crucible as provided in the apparatus of FIG. 11, then the rf coils may be maintained in a fixed position. Alternatively, the crucible assembly need not undergo translational motion if the rf coils are moved translationally as by a suitaable mechanism such as illustrated in FIG. 10. It is also, of course, within the scope of this invention to move the crucible assembly up and down in FIG. 10 by the means described for FIG. 11.

Figure 12:
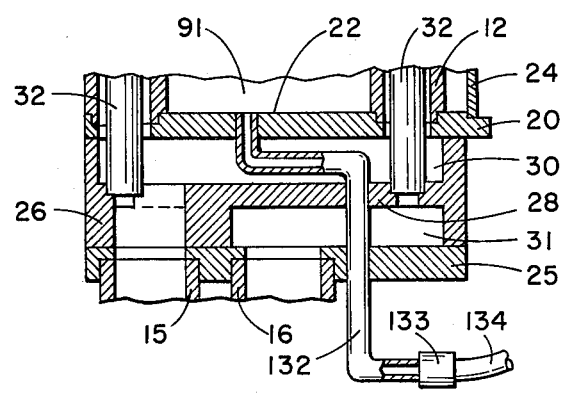
FIG. 12 is a cross section through the cooling fluid distribution means of one half-section showing a gas conduit for introducing a gas into the melt.

Finally, FIG. 12 shows the lower end of a half-section with means to deliver a gas to the melt in the crucible. This means comprises a metal conduit 132 attached through coupling 133 to a gas line 134. Conduit 132 passes up through bottom plate 25, fluid discharge chamber 31, horizontal divider plate 28, fluid inlet manifold 30 and cover plate 20 to open into melt volume 91. Gas delivery means such as conduit 132 may be associated with one or both of the half-section assemblies. Gas may be introduced for purifying the melt or to provide a reactant therefor.

As an example of the operation of the cold crucible system of this invention it may be pointed out that 1.5 kg batches of $ZrO_2$ (m.p. 2690) have been melted using an rf input power of 20KW at a frequency of 3.6 megahertz. Cooling of the crucible has been accomplished by circulating tap water at 60psi at a rate of about three gallons per minute. The "skull" or shell formed around the melt has been observed to be as little as a fraction of a millimeter thick. Essentially transparent crystals of $ZrO_2$ have been obtained from the melts. The conditions of this example are, of course, not limiting in any way and the operational parameters employed in the use of the apparatus of this invention can readily be determined for all materials processed.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

We claim:
1. A cold crucible, comprising in combination
    a. two complementary semicircular assemblies each comprising a plurality of contacting linear copper tubes arranged to form a semiannular wall, each of said tubes having a fluidtight cap at one end thereof, said linear copper tubes in each of said assemblies being affixed to a semicircular compartmentalized fluid distribution means, each said distribution means having upper and lower walls defining therebetween a separate fluid inlet manifold and a separate fluid discharge manifold; said semiannular assemblies when maintained in close but spaced relationship defining a cylindrical configured container for which said upper wall of said fluid distribution means forms the bottom;
    b. in each of said copper tubes a concentric open-ended, smaller-diameter copper tube having one end in fluid communication with said fluid discharge manifold and having the other end terminating a short distance from said cap to form a passage therebetween, each of said open-ended tubes defining within said copper tube an annular fluid passage in fluid communication with said fluid inlet manifold; and
    c. separate vertically extending inlet fluid conduits to introduce a cooling fluid into said fluid inlet manifold of each of said assemblies and separate vertically extending discharge fluid conduits to with- draw said fluid from said fluid discharge manifold of each of said semiannular assemblies whereby said cooling fluid is caused to flow upwardly through each of said annular fluid passages and downwardly through each of said smaller-diameter copper tubes to provide essentially uniform cooling around said crucible, said separate means to introduce and to withdraw said fluid for one of said assemblies being separate and distinct from the other of said assemblies, whereby said cylindrically configured container can not provide a dead short to an rf field maintained around said crucible.

2. A cold crucible in accordance with claim 1 including cover means serving as thermal radiation shield means positioned above said cylindrically configured container.

3. A cold crucible in accordance with claim 2 wherein said cover means comprises a flat plate with a central opening and view port.

4. A cold crucible in accordance with claim 2 wherein said cover means comprises a frusto-conical member with a central opening and view port.

5. A cold crucible in accordance with claim 1 including fluid conduit means extending through said semicircular compartmentalized fluid distribution means of at least one of said semicircular assemblies into the interior of said cylindrically configured container, thereby to provide fluid communication between said interior and a fluid source.

6. A cold crucible in accordance with claim 1 including a centrally positioned well, suitable for holding a seed crystal, in said upper wall of said fluid distribution means.

7. A cold crucible system comprising in combination
 a. a cold crucible comprising
  1. two complementary semicircular assemblies each comprising a plurality of contacting linear copper tubes arranged to form a semiannular wall, each of said tubes having a fluid-tight cap at one end thereof, said linear copper tubes in each of said assemblies being affixed to a semicircular compartmentalized fluid distribution means, each said distribution means having upper and lower walls defining therebetween a separate fluid inlet manifold and a separate fluid discharge manifold,
  2. in each of said copper tubes a concentric, open-ended, smaller-diameter copper tube having one end in fluid communication with said fluid discharge manifold and having the other end terminating a short distance from said cap to form a passage therebetween, each of said open-ended tubes defining within said copper tube an annular fluid passage in fluid communication with said fluid inlet manifold, and
  3. separate vertically extending inlet fluid conduits to introduce a cooling fluid into said fluid inlet manifold of each of said assemblies and separate vertically extending discharge fluid conduits to withdraw said fluid from said fluid discharge manifold of each of said assemblies whereby said cooling fluid is caused to flow upwardly through each of said annular fluid passages and downwardly through each of said smaller-diameter copper tubes to provide essentially uniform cooling around said crucible; and
 b. crucible mounting means engageable with said separate inlet and discharge fluid conduits for holding and supporting said two complementary semicircular assemblies in close but spaced relationship to define a cylindrically configured container suitable for holding the material to be melted, said upper wall of said fluid distribution means forming the bottom of said container, said crucible mounting means having a fluid inlet passage means for providing fluid communication between said inlet fluid conduits and a source of said fluid and fluid discharge passage means for providing fluid communication between said discharge fluid conduits and a receptacle for said fluid, said crucible mounting means providing the first electrical crossover below said cold crucible when said cold crucible is in an rf field.

8. A cold crucible system in accordance with claim 7 including fluid conduit means extending through said semicircular compartmentalized fluid distribution means of at least one of said semicircular assemblies into the interior of said cylindrically configured container, thereby to provide fluid communication between said interior and a fluid source.

9. A cold crucible system in accordance with claim 7 comprising rf coils surrounding said cylindrically configured container and an annular quartz sleeve between said rf coils and said cylindrically configured container.

10. A cold crucible system in accordance with claim 9 comprising a load bearing rod arranged to hold a crystal seed within said crucible, means to impart translational movement to said rod and thermal radiation shield means serving as a cover for said cylindrically configured container and having a central opening through which said rod, said seed and a crystal grown thereon are free to pass.

11. A cold crucible system in accordance with claim 9 including means to effect relative translational motion of said crucible mounting means and said rf coils.

12. A cold crucible system in accordance with claim 11 including a centrally positioned well, suitable for holding a seed crystal, in said upper wall of said fluid distribution means.

13. A cold crucible system in accordance with claim 11 including means to rotate said crucible mounting means thereby to spin said cold crucible.

14. A cold crucible system in accordance with claim 13 wherein said fluid inlet passage means in said crucible mounting means comprises an inner tubing communicating with an inlet chamber and said fluid discharge passage means comprises an annular passage defined by an outer tubing around said inner tubing, the external walls of said inlet chamber and said outer tubing forming a cylindrical unit; and including
 a. stationary bearing means associated with said cylindrical unit and defining within said bearing means a second fluid inlet manifold and a second fluid discharge manifold;
 b. fluid inlet port means providing fluid communication between said fluid inlet manifold and said inlet chamber
 c. fluid discharge port means providing fluid communication between said fluid discharge manifold and said fluid discharge means; and
 d. sealing means providing a fluid seal between said cylindrical unit and said bearing means.

15. A cold crucible system in accordance with claim 14 wherein said means to rotate said crucible mounting means comprises gear means affixed to said outer tubing, spline means engageable with said gear means and means to rotate said spline means.

* * * * *